United States Patent [19]

Kawamoto

[11] Patent Number: 5,557,582
[45] Date of Patent: Sep. 17, 1996

[54] SEMICONDUCTOR MEMORY DEVICE INHIBITING INVALID DATA FROM BEING OUTPUT

[75] Inventor: Satoru Kawamoto, Kasugai, Japan

[73] Assignees: Fujitsu Limited, Kawasaki; Fujitsu VLSI Limited, Kasugai, both of Japan

[21] Appl. No.: 264,076

[22] Filed: Jun. 22, 1994

[30] Foreign Application Priority Data

Sep. 9, 1993 [JP] Japan .................................. 5-224546

[51] Int. Cl.$^6$ ...................................................... G11C 8/00
[52] U.S. Cl. .................. 365/233.5; 365/190; 365/189.05
[58] Field of Search ................................ 365/233.5, 190, 365/189.05, 207, 208, 233

[56] References Cited

U.S. PATENT DOCUMENTS 4,922,461   5/1990   Hayakawa ............................ 365/233.5

*Primary Examiner*—A. Zarabian
*Attorney, Agent, or Firm*—Staas & Halsey

[57] ABSTRACT

A semiconductor memory device executes the control of data input/output in accordance with control signals and address signals. The device includes data buses, a memory cell array including a plurality of memory cells, a circuit for selecting a specific memory cell from the memory cells to provide the data buses with cell information data stored in the selected cell and data output control circuit for controlling data output from the memory device, based on at least one control signal provided to the control circuit. The control circuit has an output terminal for outputting the output data, and maintains the terminal at a high-impedance state as long as the cell information provided on the data buses is not supplied to the control circuit.

4 Claims, 7 Drawing Sheets

5,557,582

SEMICONDUCTOR MEMORY DEVICE INHIBITING INVALID DATA FROM BEING OUTPUT

BACKGROUND OF THE INVENTION

1. Field of the Invention

The present invention generally relates to a semiconductor memory device. More particularly, this invention relates to a device for reading cell information from memory cells in a semiconductor memory device.

2. Description of the Related Art

With the rapid change in integrated circuit technology, there is an increasing demand for semiconductor memory devices that incorporate a larger memory capacity and operate at increasingly faster speeds. To achieve such an increase in such a device's operating speed, the power consumption and noise burdens on a supply voltage should be reduced. It is therefore necessary to reduce the power consumption and noise burdens on the supply voltage, in cell information reading devices, and thereby to increase the operation speed thereof.

In reading cell information from a DRAM, as an example of a semiconductor memory device, a specific memory cell is selected based on address signals. The cell information stored in the selected memory cell is read out onto bit lines. The read cell information is latched and amplified by a sense amplifier and is then output onto data buses. The cell information, output on the data bus, is further amplified and latched by a sense buffer. The cell information latched by the sense buffer is output to an external circuit via an output circuit.

In the above-mentioned DRAM, cell information is read in a specific order from memory cells by a repetitive reading operation, wherein a single reading cycle is defined from the input of an instruction signal, to start the reading operation, to the output of the read cell information from the output circuit. As soon as the reading operation starts, the output circuit is enabled, so as to output the data latched in the sense buffer. At the beginning of the reading operation, the sense buffer latches the cell information that has been read in the previous cycle, and the latched cell information must be temporarily output as invalid data from the output circuit. Then, after the normal accessing time in the reading operation has elapsed, the cell information read from the selected memory cell is latched by the sense buffer, and then the latched cell information is output as valid data from the output circuit.

When the invalid data and the valid data have a complementary relation, it is necessary for the output circuit to invert the invalid data, which has been temporarily output, in order to output the valid data. This hinders the improvement in the reading speed, from the selection of a specific memory cell to the outputting of the cell information in that memory cell as valid data.

When invalid data is switched to valid data, a through current between a High voltage-supply and a Low voltage supply (e.g. ground level) and/or a charge/discharge current between a terminal and one of the High and low voltage-supplies is generated in the output circuit and/or in another circuit at the preceding stage thereof. Such a through current, or a charge/discharge current increases the consumed power, and causes supply-voltage noise to occur.

SUMMARY OF THE INVENTION

It is a primary object of the present invention to provide a semiconductor memory device which can inhibit invalid data from being output in a reading operation, thereby to increase the reading speed and to reduce the consumed power and supply-voltage noise.

To achieve the foregoing and other objects and in accordance with the purpose of the present invention, an improved semiconductor memory device is provided.

The semiconductor memory device according to the present invention executes the control of data input/output in accordance with a plurality of control signals and address signals. The memory device comprises data buses, a memory cell array including a plurality of memory cells storing cell information data, and a circuit for selecting a specific memory cell, from the plurality of memory cells of the array, to provide the data buses with cell information data stored in the selected memory cell. The memory device further comprises a data output control circuit connected to the data buses. The control circuit controls the output of the data from the semiconductor memory device, based on at least one control signal provided to the control circuit. The control circuit has a unit for latching a signal, based on cell information data provided on the data buses, and an output terminal for outputting the output data to be produced, based on the latched signal. The data output control circuit maintains the output terminal at a high-impedance state as long as the cell information provided on the data buses is not supplied to the data output control circuit.

It is preferable that the control signal provided to the data output control circuit includes at least one of a sense amplifier enable signal and an address change detection signal.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings, in which:

DETAILED DESCRIPTION OF THE PREFERRED EMBODIMENTS

Figure 1:
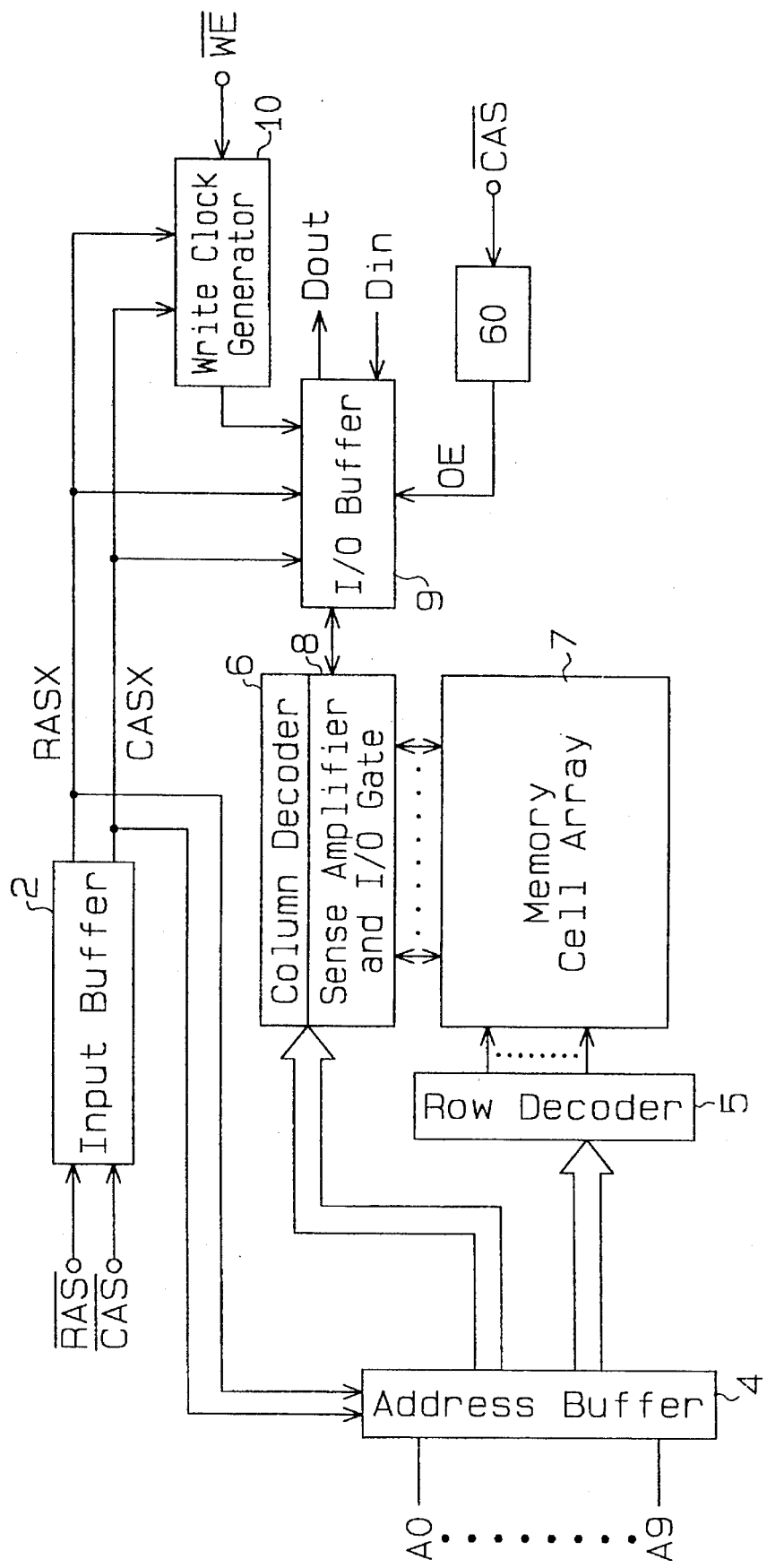
FIG. 1 is a block diagram showing a DRAM according to an embodiment of the present invention.

FIG. 1 illustrates the schematic structure of a DRAM according to an embodiment of the present invention. Control signals /RAS (Row Address Strobe Signal) and /CAS (Column Address Strobe Signal), which control the operation of the DRAM, are output as control signals RASX and CASX to internal circuits of the DRAM via an input buffer 2 of the DRAM. The control signal CASX is input to an address buffer 4 as a signal to latch a column address. The control signal RASX is also input to the address buffer 4 as a signal to latch a row address. The control signal RASX is input to an input/output (I/O) buffer 9 as an active or enable signal, and the control signal CASX is likewise input to the I/O buffer 9 as an input/output control signal. Further, the control signal RASX is input to a write clock generator 10 as an activate signal for activating the clock generator 10. The control signal CASX is likewise input to the write clock generator 10 as a signal to latch a write enable signal /WE which is input to the clock generator 10.

Address signals A0 to A9 input to the address buffer 4 are latched by the address buffer 4, based on the control signals RASX and CASX, and are output therefrom to a row decoder 5 and a column decoder 6. The row decoder 5 and column decoder 6 select specific memory cells in a memory cell array 7, based on the address signals A0 to A9. At the time of reading cell information, the cell information read from the selected memory cells are output as output data $D_{out}$ via a sense amplifier and I/O gate 8 and the I/O buffer 9. At the time of writing cell information, write data Din, which is received by the I/O buffer 9, is written in the selected memory cells via the sense amplifier and I/O gate 8. The I/O buffer 9 is controlled, based on four signals: the control signals RASX and CASX, the write enable signal /WE provided thereto via the write clock generator 10 and an output control signal OE which is generated by a signal generator 60 in the DRAM, based on the control signal /CAS.

Figure 2:
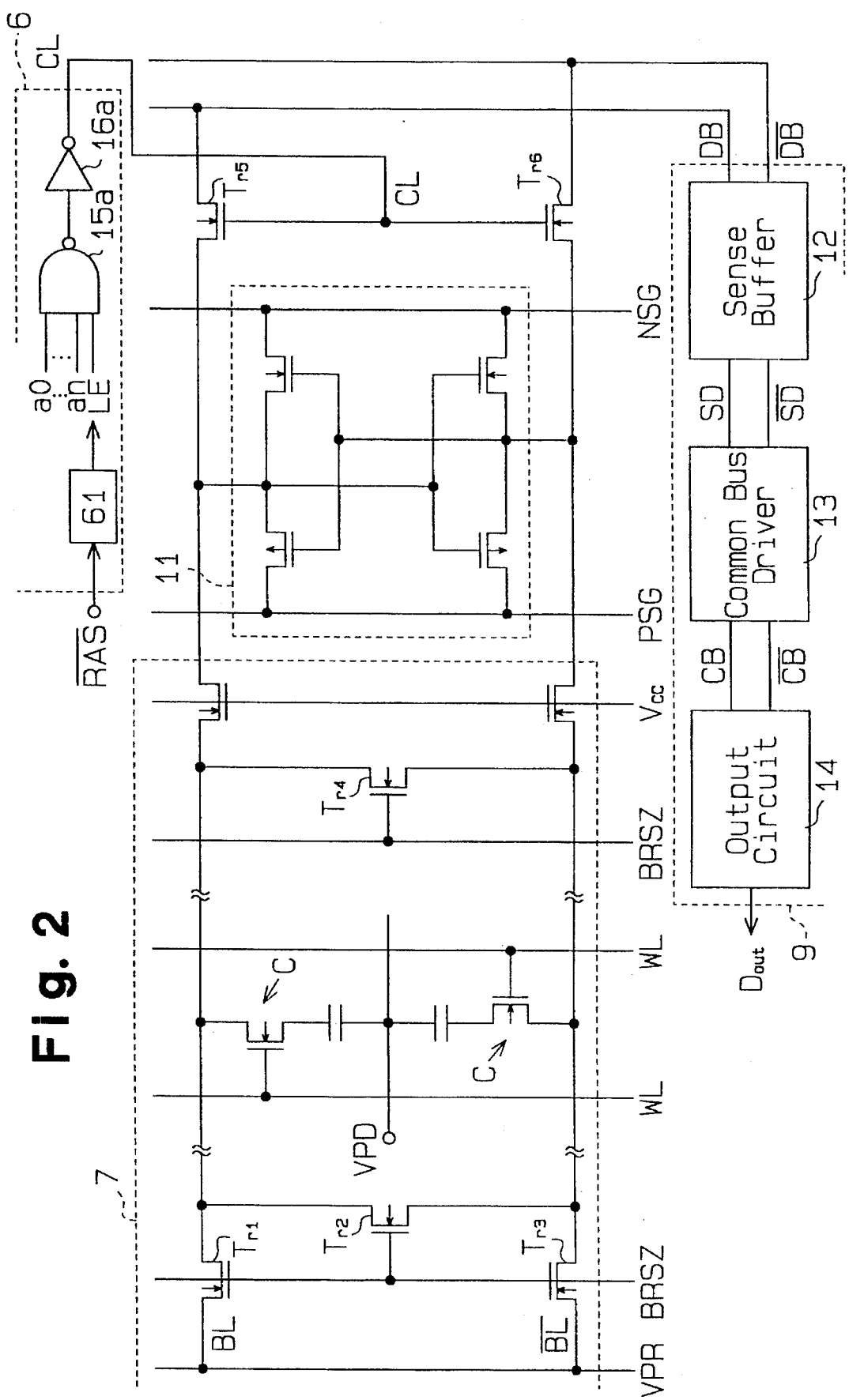
FIG. 2 is a circuit diagram showing a reading circuit of the DRAM as shown in FIG. 1.

The structure of circuits for use in reading cell information in the DRAM will now be described, referring to the drawings. As shown in FIG. 2, the memory cell array 7 has many pairs of bit lines BL and /BL. A plurality of memory cells C are connected to the bit lines BL and /BL of each pair. A word line WL is connected to each memory cell C. When one of the word lines WL is selected by the row decoder 5 (FIG. 1), cell information stored in the associated memory cell C is read onto the bit lines BL and /BL.

N channel MOS transistors Tr1, Tr2, Tr3 and Tr4, connected to the bit lines BL and /BL, form a circuit for resetting the potentials at of the bit lines BL and /BL to a reset potential VPR when the bit lines BL and /BL and the word line WL are not selected. When an H-level reset signal BRSZ is input to the gates of the individual transistors Tr1 to Tr4, the transistors Tr1 to Tr4 are turned on, resetting the potentials at the bit lines BL and /BL to the reset potential VPR of, for example, Vcc/2 that is an average between a ground level and a supply voltage Vcc.

A sense amplifier 11 is Connected to a pair of the bit lines BL and /BL, and is supplied with a high-potential supply voltage PSG and a low-potential supply voltage NSG. The sense amplifier 11 is controlled using a sense amplifier enable signal LE generated based on the signal /RAS. The sense amplifier 11, when enabled, amplifies and latches the cell information supplied on the bit lines BL and /BL.

The sense amplifier and I/O gate 8 includes the sense amplifier 11 and column gates Tr5 and Tr6. The bit lines BL and /BL are connected via the column gates Tr5 and Tr6 to data buses DB and /DB, as shown in FIG. 2. The column gates Tr5 and Tr6 receive a column select signal CL from the column decoder 6. When the column select signal CL goes high, the column gates Tr5 and Tr6 are enabled and allow the cell information, amplified by the sense amplifier 11, to be output on the data buses DB and /DB.

The column decoder 6 comprises a NAND gate 15a, an inverter circuit 16a and a signal generator 61 which generates the sense-amplifier enable signal LE based on the control signal /RAS, as shown in FIG. 2. The NAND gate 15a receives the sense-amplifier enable signal LE and decode signals "$a_0$" to "$a_n$" originated from the address signals A0 to A9. The output signal of the NAND gate 15a is input to the inverter circuit 16a whose output signal is output as the column select signal CL to the column gates Tr5 and Tr6. When the decode signals $a_0$ to $a_n$ and the sense amplifier enable signal LE goes high, the column select signal CL goes high, turning the column gates Tr5 and Tr6 on. The column decoder 6 includes a plurality of output circuits, each of which is formed by a pair of the NAND gate 15a and an inverter circuit 16a, in order to control the column gates Tr5 and Tr6 corresponding to the associated bit line pair.

The I/O buffer 9 comprises a sense buffer 12, a common bus driver 13 and an output circuit 14, as shown in FIG. 2. The data buses DB and /DB are connected to the sense buffer 12. The output signals of the sense buffer 12, SD and /SD, are input to the common bus driver 13 whose output signals CB and /CB are input to the output circuit 14. The output circuit 14 outputs the output data $D_{out}$.

Figure 3:
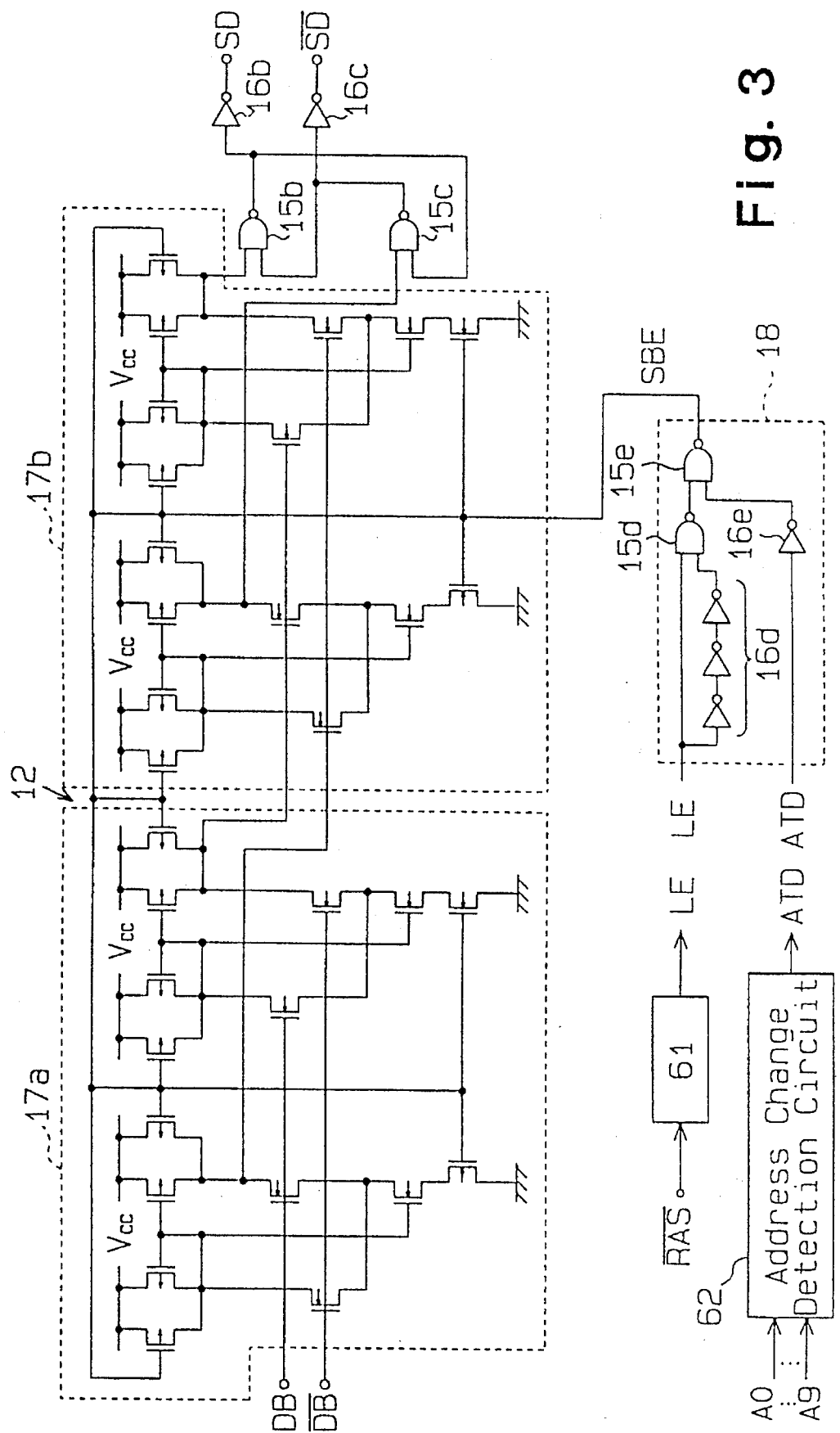
FIG. 3 is a circuit diagram showing a sense buffer in the reading circuit of the DRAM.

The specific structure of the sense buffer 12 will be described referring to FIG. 3. This sense buffer 12 comprises two stages of current mirror circuits 17a and 17b connected in series, NAND gates 15b and 15c which constitute a latch circuit, inverter circuits 16b and 16c forming an output circuit, and an enable signal generator 18 for enabling the current mirror circuits 17a and 17b. As the current mirror circuits are well known, their detailed description will not be given. The enable signal generator 18 receives the sense amplifier enable signal LE from the signal generator 61 and an address change detection signal ATD from a circuit 62 for detecting the change of the address signals A0 to A9. The address change detection circuit 62 outputs the signal ATD, a one-shot high level pulse signal, given a change in any one of the address signals A0 to A9 input to the column decoder.

The enable signal generator 18 includes two NAND gates 15d and 15e and four invertor circuits 16d and 16e. The sense amplifier enable signal LE is input to a first input terminal of the NAND gate 15d and is input to a second input terminal of the NAND gate 15d via the three inverter circuits 16d. Accordingly, the NAND gate 15d outputs a L-level one-shot pulse signal when the sense amplifier enable signal LE goes high; otherwise, the output signal of the NAND gate 15d remains high.

The L-level output signal of the NAND gate 15d is input to a first input terminal of the NAND gate 15e, and the aforementioned address change detection signal ATD is input to a second input terminal of the NAND gate 15e via the inverter circuit 16e. When the sense amplifier enable signal LE goes high or when the address change detection signal ATD is input to the enable signal generator 18, the NAND gate 15e outputs an H-level one-shot pulse signal as an output signal SBE. The current mirror circuits 17a and 17b are enabled in response to the output signal SBE. This operation is called "auto power-down" and reduces the consumed power of the sense buffer 12.

When the output signal SBE goes high, the current mirror circuits 17a and 17b are enabled to amplify and output the cell information read on the data buses DB and /DB. One of the complementary output signals of the current mirror circuit 17b is input to a first input terminal of the NAND gate 15b, while the other complementary output signal is input to a first input terminal of the NAND gate 15c. The output signal of the NAND gate 15b is input to a second input terminal of the NAND gate 15c and the inverter circuit 16b. The output signal of the NAND gate 15c is input to a second input terminal of the NAND gate 15b and the inverter circuit 16c. Accordingly, the NAND gates 15b and 15c latch the complementary output signals of the current mirror circuit 17b and output the latched signals to the inverter circuits 16b and 16c. The output signals SD and /SD of the inverter circuits 16b and 16c are output to the common bus driver 13 (FIG. 2).

Figure 4:
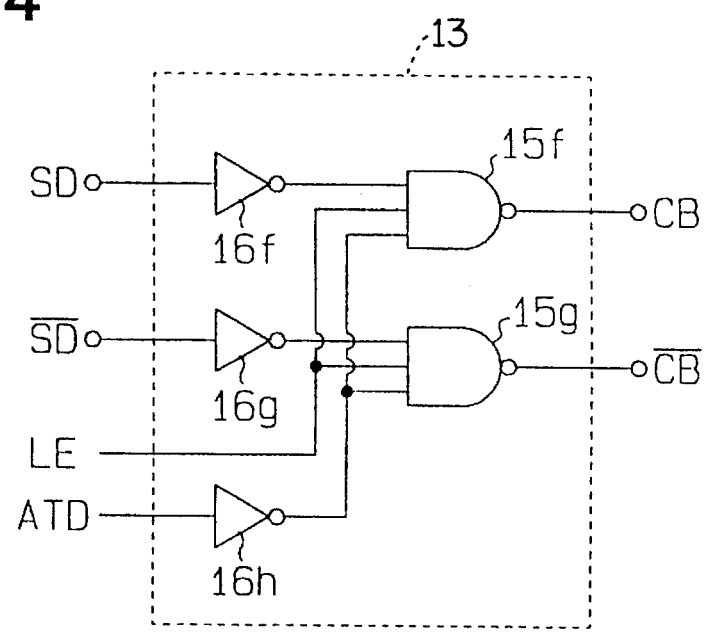
FIG. 4 is a circuit diagram showing a common bus driver in the reading circuit of the DRAM.

The common bus driver 13 includes two NAND gates 15f and 15g and three inverter circuits 16f, 16g and 16h, as shown in FIG. 4. The output signal SD is input via the inverter circuit 16f to the NAND gate 15f and the output signal /SD is input via the inverter circuit 16g to the NAND gate 15g. The sense amplifier enable signal LE is input to the NAND gates 15f and 15g, and the address change detection signal ATD is input thereto via the inverter circuit 16h. When the sense amplifier enable signal LE goes high and when the address change detection signal ATD goes low, signals in phase with the output signals SD and /SD of the sense buffer 12 are output as the output signals CB and /CB from the NAND gates 15f and 15g. When the sense amplifier enable signal LE goes low or when the address change detection signal ATD goes high, the output signals CB and /CB of the NAND gates 15f and 15g both go low.

Figure 5:
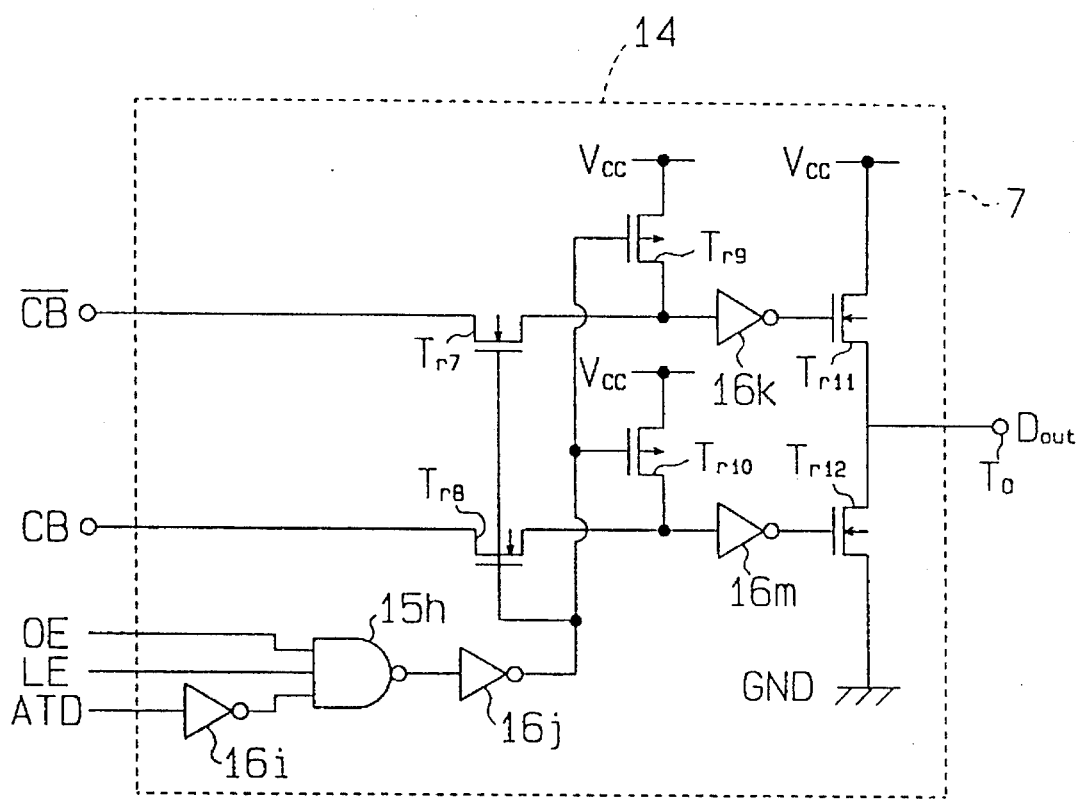
FIG. 5 is a circuit diagram showing an output circuit in the reading circuit of the DRAM.

As shown in FIG. 5, the output circuit 14 receives the output signals CB and /CB of the common bus driver 13, the output control signal OE, the sense amplifier enable signal LE and the address change detection signal ATD. The output circuit 14 includes a NAND gate 15h for receiving the output control signal OE, the sense amplifier enable signal LE and the address change detection signal ATD input thereto via an inverter circuit 16i. The output circuit 14 further includes an inverter circuit 16j which receives the output signal of the NAND gate 15h. The output signal of the inverter circuit 16j is input to the gates of N channel MOS transistors Tr7 and Tr8 and the gates of P channel MOS transistors Tr9 and Tr10.

The output signal /CB from the common bus driver 13 is input via the transistor Tr7 to an inverter circuit 16k, and the output signal CB is input via the transistor Tr8 to an inverter circuit 16m. The input terminal of the inverter circuit 16k is connected to the drain of the transistor Tr9. The input terminal of the inverter circuit 16m is connected to the drain of the transistor Tr10. The sources of the transistors Tr9 and Tr10 are connected to a power supply Vcc.

The output signal of the inverter circuit 16k is input to the gate of an N channel MOS output transistor Tr11, and the output signal of the inverter circuit 16m is input to the gate of an N channel MOS output transistor Tr12. The drain of the transistor Tr11 is connected to the power supply Vcc. The source of the transistor Tr11 and the drain of the transistor Tr12 are connected to an output terminal $T_0$. The source of the transistor Tr12 is connected to a ground GND. The transistors Tr7, Tr8, Tr9 and Tr10 form a switching circuit that selects one of two modes to drive transistors Tr11 and Tr12. The first mode drives both Tr11 and Tr12 in accordance with the output signals CB and /CB from the common bus driver 13. The second mode drives the output terminal $T_o$ in an high impedance state when both transistors Tr11 and Tr12 are turned off.

The operation of the above configured DRAM will now be described with reference to FIG. 6. When a control signal /RAS input to the DRAM goes low, peripheral circuits of the memory cell array 7, such as the address buffer 4 are enabled. When row address signals are input to the row decoder 5, the potential of the word line WL, selected by the row decoder 5 in response to the row address signals, goes high. Consequently, the memory cells C connected to the selected word line WL, are enabled and have their cell information read onto the bit lines BL and /BL. This produces a slight potential difference between the bit lines BL and /BL.

At this time, both the output control signal OE and the sense amplifier enable signal LE are asserted low and, consequently, force the transistors Tr7 and Tr8 of the output circuit 14 off and the transistors Tr9 and Tr10 on. Therefore, the output signals of the inverter circuits 16k and 16m both go low and the output transistors Tr11 and Tr12 are both turned off. This forces the output terminal $T_o$ to a high-impedance state.

The sense buffer 12 latches the data read in the previous reading cycle and outputs the complementary output signals SD and /SD, while the output signals CB and /CB of the common bus driver 13 both go low. This happens regardless of the output signals SD and /SD, due to the low level sense amplifier enable signal LE. The output control signal OE then is asserted high in accordance with the falling of the control signal /CAS. In this situation, the sense-amplifier enable signal LE remains low and forces the output signals CB and /CB of the common bus driver 13 high and the output terminal $T_o$ to a high-impedance state.

When the sense-amplifier enable signal LE goes high, the sense amplifier 11 is enabled to amplify the slight potential difference between the bit lines BL and /BL. At that time, the column select signal CL, selected by the column decoder 6 based on the column address signals, goes high. Consequently, the column gates Tr5 and Tr6 are turned on and enable cell information, read out onto the bit lines BL, and /BL to be output on the data buses DB and /DB.

As the sense amplifier enable signal LE rises, the enable signal generator 18 in the sense buffer 12 outputs the H-level one-shot pulse signal SBE to temporarily enable the current mirror circuits 17a and 17b. Cell information read on the data buses DB and /DB is then amplified by the current mirror circuits 17a and 17b. The amplified cell information is latched by the NAND gates 15b and 15c and output as the output signals SD and /SD from the inverter circuits 16b and 16c.

The common bus driver 13 outputs the output signals CB and /CB in phase with the output signals SD and /SD from the sense buffer 12, in accordance with the H-level sense amplifier enable signal LE and the L-level address change detection signal ATD. The transistors Tr7 and Tr8 in the output circuit 14 are turned on and the transistors Tr9 and Tr10 are turned off, in response to the H-level output control signal OE, the H-level sense amplifier enable signal LE and the L-level address change detection signal ATD.

As a result, the output signals CB and /CB from the common bus driver 13 are input via the transistors Tr7 and Tr8 to the inverter circuits 16k and 16m. The complementary output signals from the inverter circuits 16k and 16m cause the output transistor Tr11 and Tr12 to be complementarily controlled. For example, when the output transistor Tr11 is turned on and the output transistor Tr12 is turned off, based on the complementary output signals from the inverter circuits 16k and 16m, an H-level output data $D_{out}$ is output from the output terminal $T_o$.

Figure 7:
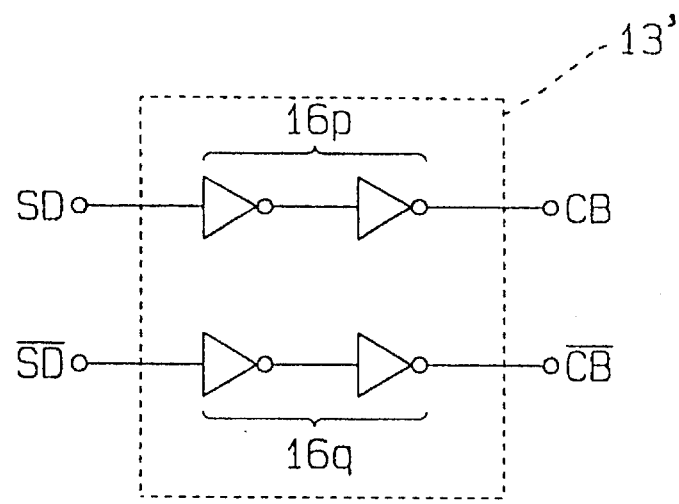
FIG. 7 is a circuit diagram showing a conventional common bus driver.
Figure 8:
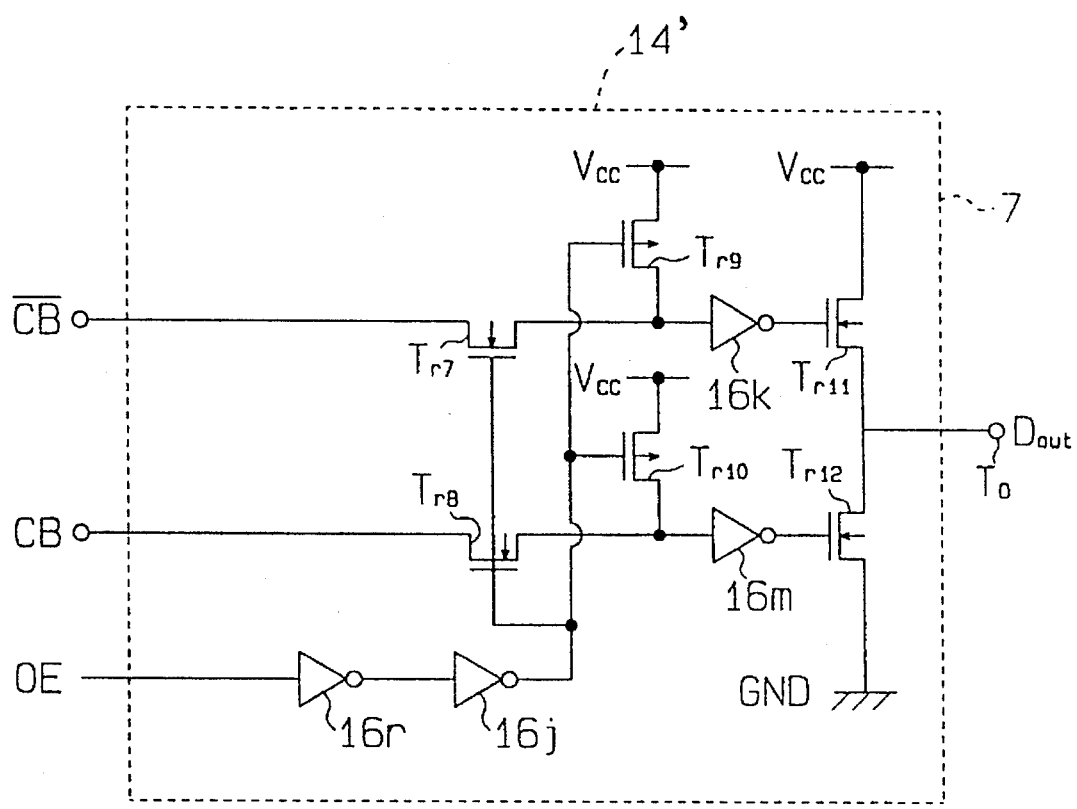
FIG. 8 is a circuit diagram showing a conventional output circuit.

FIG. 7 shows a conventional common bus driver 13' provided with four inverter circuits forming a pair of two stage invertor circuits 16p and 16q. FIG. 8 shows a conventional output circuit 14' in association with the common bus driver 13'. The output circuit 14' differs from the output circuit 14 of this embodiment, in that the invertor circuits 16r receive only the output control signal OE instead of the NAND gate 15h in the output circuit 14.

Figure 6:
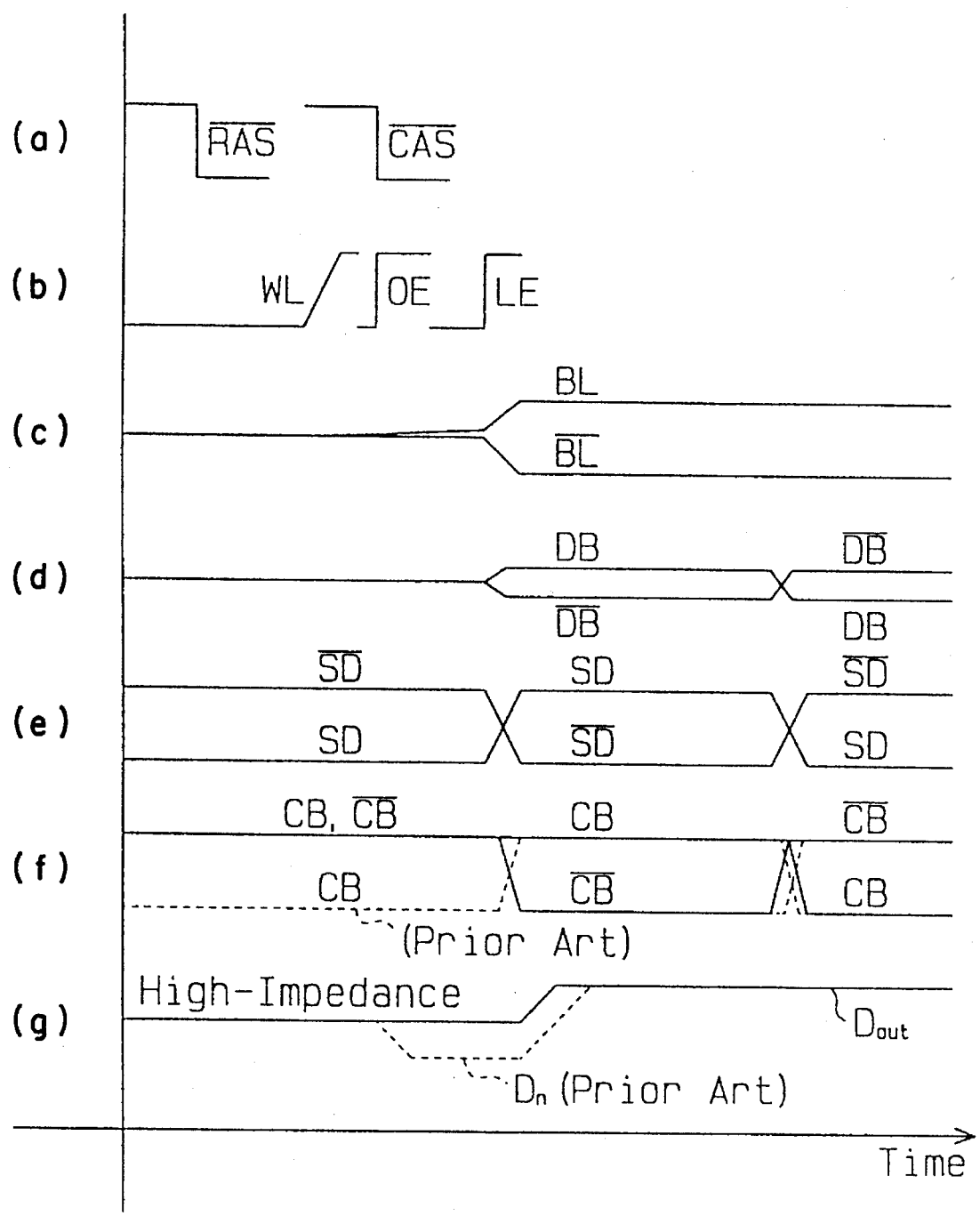
FIG. 6 is a waveform diagram illustrating a reading operation of the reading circuit.

The conventional common bus driver 13' outputs the signals CB and /CB in phase with the output signals SD and /SD of the sense buffer 12, as shown in FIG. 6. The conventional output circuit 14' outputs the output data, based on the output signals CB and /CB. When the output control signal OE goes high, the output circuit 14' outputs, for example, L-level invalid data $D_n$, read in the previous cycle as the output data $D_{out}$, based on the complementary output signals CB and /CB. Subsequently, when the cell information read from newly selected memory cells is latched by the sense buffer 12 and output as the output signals SD and /SD, the output signals CB and /CB of the common bus driver 13', for example, invert the output data $D_{out}$.

According to this embodiment, in contrast, until the sense amplifier enable signal LE rises, the output signals CB and /CB of the common bus driver 13 both remain asserted high. Moreover, the output transistors Tr11 and Tr12 of the output circuit 14 are both turned off, keeping the output data $D_{out}$ at a high-impedance state. When the sense-amplifier enable signal LE goes high and the sense buffer 12 outputs valid data, the common bus driver 13 and the output circuit 14 are enabled to output the valid data as the output data $D_{out}$.

Thus, according to this embodiment, since valid data is timely output as the output data $D_{out}$ without outputting invalid data $D_n$, the rising speed and falling speed of the output data $D_{out}$ can be improved, thereby to increase the memory reading speed. Furthermore, signal inversion from invalid data $D_n$ to valid data does not occur in the common bus driver 13 and the output circuit 14. Therefore, the through current (e.g. between Vcc and GND in FIG. 5) and/or the charge/discharge current (e.g. between the output terminal $T_o$ and one of Vcc and GND) are prevented or restricted, thus reducing the circuit's consumption of power. Inasmuch as the generation of the through current is prevented or restricted, it is possible to prevent noise in the Vcc and/or GND from occurring due to the through current.

Figure 9:
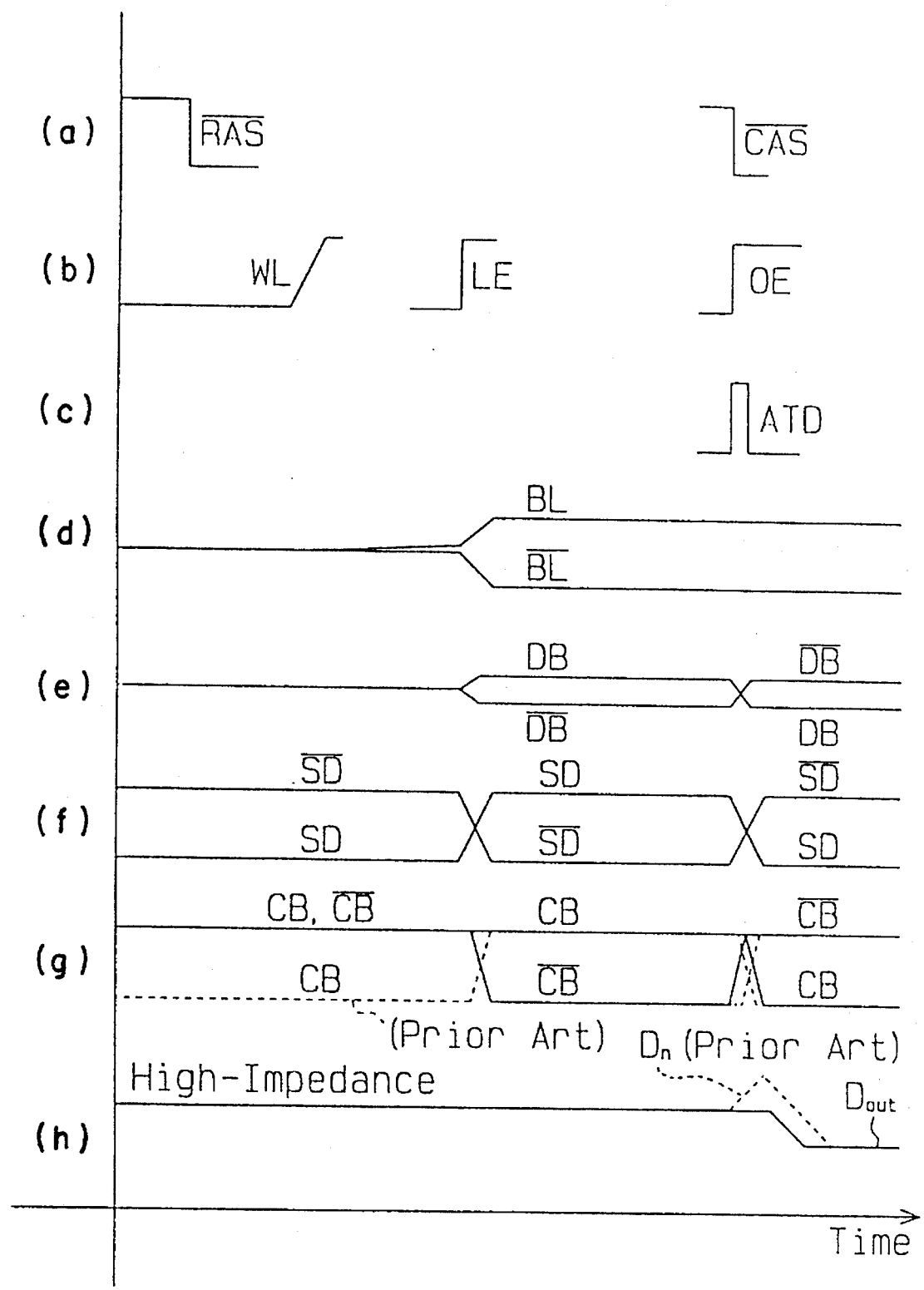
FIG. 9 is a waveform diagram illustrating another reading operation of the reading circuit shown in FIG. 2.

Although the embodiment has been described with reference to the case where the reading operation is controlled by causing the sense amplifier enable signal LE to rise after the falling of the control signal /CAS, the DRAM according to the above-mentioned embodiment may be adapted to the reading operation control accomplished by causing the control signal /CAS to fall after the rising of the sense-amplifier enable signal LE. The operation in the latter case will now be discussed with reference to FIG. 9.

When the control signal /RAS goes low and the row address signals are input to the row decoder 5, the potential of the word line WL, which is selected by the row decoder 5 based on the row address signals, goes high. Consequently, the memory cells C connected to the selected word line WL are enabled and their cell information are read on the bit lines BL and /BL, producing a slight potential difference between the bit lines BL and /BL. As the output control signal OE and sense amplifier enable signal LE are then both at a L-level, the transistors Tr7 and Tr8 in the output circuit 14 are turned off and the transistors Tr9 and Tr10 are turned on. Accordingly, the output signals of the inverter circuits 16k and 16m go low and the output transistors Tr11 and Tr12 are both turned off, forcing the output terminal $T_o$ to a high-impedance state.

The sense buffer 12 is latching the read data in the previous cycle and is outputting the complementary output signals SD and /SD, while the output signals CB and /CB of the common bus driver 13 both go high, regardless of the complementary output signals SD and /SD, because the sense-amplifier enable signal LE is low.

When the sense amplifier enable signal LE goes high based on the control signal /RAS, the sense amplifier 1 is enabled to amplify the slight potential difference between the bit lines BL and /BL. The column select signal CL associated with the column, which is selected by the column decoder 6 in accordance with the column address signals, goes high. Consequently, the column gates Tr5 and Tr6 are turned on, causing the cell information read on the bit lines BL and /BL to be output on the data buses DB and /DB.

In accordance with the address change detection signal ATD, the enable signal generator 18 in the sense buffer 12 outputs a H-level one-shot pulse signal SBE to temporarily enable the current mirror circuits 17a and 17b. Then, the cell information read on the data buses DB and /DB is amplified by the current mirror circuits 17a and 17b. The amplified cell information signals is latched by the NAND gates 15b and 15c and is output as the output signals SD and /SD from the inverter circuits 16b and 16c.

The common bus driver 13 outputs the output signals CB and /CB in phase with the output signals SD and /SD of the sense buffer 12, based on the H-level sense amplifier enable signal LE and the L-level address change detection signal ATD. The transistors Tr7 and Tr8 in the output circuit 14 are turned off and the transistors Tr9 and Tr10 are turned on, in accordance with the L-level output control signal OE. Regardless of the output signals CB and /CB from the common bus driver 13, the output signals of the inverter circuits 16k and 16m go low and the output terminal $T_o$ is forces into a high-impedance state.

When the output control signal OE goes high in synchronism with the falling of the control signal /CAS and change in column address signal, the address change detection signal ATD is then input to the enable signal generator 18, the common bus driver 13 and the output circuit 14. With the address change detection signal ATD being set high, the output terminal $T_o$ (i.e., output data $D_{out}$) is kept at the high-impedance state. When the address change detection signal ATD goes low, the common bus driver 13 outputs the output signals CB and /CB in phase with the output signals SD and /SD of the sense buffer 13. Based on the output signals CB and /CB, the output circuit 14 outputs the output data $D_{out}$.

According to the conventional art, at this time, the output circuit 14' functions, based on the rising edge of the output control signal OE, and outputs invalid data $D_n$ in accordance with the output signals CB and /CB from the common bus driver 13. This output is based on the cell information at the previous address, as indicated by the broken lines in FIG. 9. In response to the switching of the output signals SD and /SD of the sense buffer 12, based on the input of the address change detection signal ATD, the output signals CB and /CB of the common bus driver 13' are switched, causing the output circuit 14' to output valid data as the output data $D_{out}$.

According to this embodiment, the output signals CB and /CB from the common bus driver 13 are temporarily reset to an H-level in accordance with the rising edge of the address change detection signal ATD. Until the address change detection signal ATD falls, the output transistors Tr11 and Tr12 in the output circuit 14 are both turned off, keeping the output terminal $T_o$ at a high-impedance state. When the address change detection signal ATD falls, valid data is output as the output data $D_{out}$.

Since valid data is output as the output data $D_{out}$ without generating invalid data, the reading speed can be improved. In addition, according to this embodiment, due to the fact that data inversion between invalid data and valid data does not occur, the through current due to the data inversion can be prevented or restricted, thus reducing the consumed power. The prevention or restriction of the through current inhibits the generation of supply-voltage noise.

Although only one embodiment of the present invention has been described herein, it should be apparent to those skilled in the art that the present invention may be embodied in many other specific forms without departing from the spirit or scope of the invention. Particularly, it should be understood that the present invention may be embodied in the following manners.

The sense buffer 12 does not always need two stages of the current mirror circuits connected in series, but may include only a single stage of the current mirror circuit. The NAND gates 15b and 15c in the sense buffer 12, which constitute a latch circuit, may be replaced with another (i.e., a different) latch circuit comprising an inverter-based positive feedback circuit.

The inverter circuits 16b and 16c, which output signals SD and /SD from the sense buffer 12, may be replaced with NAND gates that receive the inverted sense amplifier enable signal LE and the address change detection signal ATD as input signals. This allows for the timing of cell information signals SD and /SD as output from the sense buffer 12 using the sense amplifier enable signal LE or the address change detection signal ATD.

Therefore, the present examples and embodiments are to be considered as illustrative and not restrictive and the invention is not to be limited to the details given herein, but may be modified within the scope of the appended claims.

What is claimed is:

1. A semiconductor memory device which executes the control of data input/output in accordance with a plurality of control signals and address signals, comprising:

a plurality of memory cells storing cell information data;

word lines connected to respective said memory cells, for selecting one of said memory cells;

bit lines connected to respective said memory cells, for receiving cell information data read from the selected memory cell;

data buses connected to respective said bit lines;

a column gate circuit for regulating supply of said cell information data from said bit lines to said respective data buses;

a sense buffer connected to said data buses and latching complementary signals, based on said cell information data;

a bus driver connected to said sense buffer and outputting complementary signals based on said complementary signals latched by, and input thereto from, said sense buffer; and an output circuit connected to said bus driver and outputting output data, based on said complementary signals output by said bus driver and input thereto and on at least one of a sense amplifier enable signal and an address change detection signal, provided as control signals to said output circuit, said output circuit comprising:

an output terminal for outputting said output data, a switching circuit which receives said complementary signals from said bus driver, at least one output transistor, connected between said switching circuit and said output terminal, and a logical product circuit having an output terminal connected to said switching circuit, a first input terminal for receiving an output control signal as one of said control signals provided to said output circuit, and a second input terminal for receiving one of said sense amplifier enable signal and said address change detection signal, said switching circuit being enabled in response to an output signal from said logical product circuit, said output circuit maintaining said output terminal at a high-impedance state as long as said sense buffer does not receive cell information data from said memory cell.

2. The semiconductor memory device according to claim 1, wherein said bus driver comprises: output by said sense buffer, each of said logical product circuits having a first input terminal for receiving one of said complementary signals and a second input terminal for receiving one of said sense amplifier enable signal and said address change detection signals.

3. The semiconductor memory device according to claim 1, further comprising:

a signal generator producing said output control signal based on a column address strobe signal provided to the semiconductor memory device.

4. The semiconductor memory device according to claim 1, further comprising:

a circuit for producing the address change detection signal, based on the address signals provided to the semiconductor memory device.

* * * * *

UNITED STATES PATENT AND TRADEMARK OFFICE
CERTIFICATE OF CORRECTION

PATENT NO. : 5,557,582
DATED : September 17, 1996
INVENTOR(S) : Satoru KAWAMOTO

It is certified that error appears in the above-indentified patent and that said Letters Patent is hereby corrected as shown below:

Col. 10, Claim 2, after "comprises" insert a new paragraph and begin with --a pair of logical product circuits associated with said complementary signals-- and return to "output by..."

Signed and Sealed this

Twenty-fourth Day of December, 1996

Attest:

BRUCE LEHMAN

Attesting Officer     Commissioner of Patents and Trademarks